United States Patent [19]

Maddaloni

[11] 4,119,915

[45] Oct. 10, 1978

[54] ELECTRONIC TUNING SYSTEM FOR RADIO RECEIVERS, WITH DIGITAL MEMORIZATION OF THE SIGNAL FREQUENCY

[75] Inventor: Ciro Maddaloni, Rome, Italy

[73] Assignee: Voxson S.p.A., Italy

[21] Appl. No.: 771,586

[22] Filed: Feb. 24, 1977

[30] Foreign Application Priority Data

Mar. 9, 1976 [IT] Italy ............................... 48484 A/76

[51] Int. Cl.² .............................................. H04B 1/06
[52] U.S. Cl. ................................... 325/452; 325/464; 334/18
[58] Field of Search ............... 325/452, 453, 457, 470, 325/464, 465, 466, 427, 334, 335; 334/11, 18

[56] References Cited

U.S. PATENT DOCUMENTS

| | | | |
|---|---|---|---|
| 3,737,787 | 6/1973 | Wolfram | 325/470 |
| 3,818,353 | 6/1974 | Sakamoto | 325/470 |
| 3,822,405 | 7/1974 | Sakamoto | 325/470 |
| 3,845,393 | 10/1974 | Basset | 325/457 |
| 3,943,449 | 3/1976 | Hendrickson et al. | 325/453 |
| 3,965,336 | 6/1976 | Grohmann | 325/455 |
| 3,978,411 | 8/1976 | Sakamoto | 325/470 |
| 3,999,131 | 12/1976 | Fukuda | 325/470 |
| 4,031,491 | 6/1977 | Sakamoto | 325/458 |

FOREIGN PATENT DOCUMENTS

294,824  12/1965  Australia ................................. 325/453

*Primary Examiner*—Robert L. Griffin
*Assistant Examiner*—Tommy P. Chin
*Attorney, Agent, or Firm*—Beveridge, De Grandi, Kline & Lunsford

[57] ABSTRACT

An electronic tuning system for radio receivers, with digital memorization of the signal frequencies. A manual control generates a first control voltage. A clock pulse generator applies pulses to a counter, the output of which is connected to a digital-to-analog converter to supply a second control voltage, indicative of the number of clock pulses counted by the counter, to electronic tuning circuitry of an electronically tuned radio receiver. A voltage comparator receives the digital-to-analog converter output and the output from the manual control. The output of the voltage comparator is applied to a gate circuit which controls application of the clock pulse signals to the counter so that these signals are discontinued when the output signal from the digital-to-analog converter is substantially equal to the output from the manual control. A digital memory couples the counter output to the input of the digital-to-analog converter and is arranged to digitally store clock pulse count signals corresponding to control frequencies associated with tuning frequencies of selected radio broadcasting stations.

5 Claims, 4 Drawing Figures

ELECTRONIC TUNING SYSTEM FOR RADIO RECEIVERS, WITH DIGITAL MEMORIZATION OF THE SIGNAL FREQUENCY

In the radio-receiving sets, particularly when used in motor cars use is frequently made of electro-mechanical systems for memorizing the tuning of certain broadcasting radio stations considered most interesting by the user.

Normally, these devices can be divided in two categories, according to the member used in the tuner for effecting the tuning of the front end of the receiver, namely mechanical systems and electric systems.

Three systems are commonly used for changing the tuning frequency of an oscillating circuit: changing the capacitance, changing the inductance, or changing a control current or voltage which determines the change of one of the two parameters (inductance or capacitance) of the oscillating circuit.

The radio tuning memory system is characterized according to the means adopted to perform the tuning operations.

Leaving out of consideration for the moment the mechanically variable capacitor system, at present almost abandoned in radio receivers for motor cars, we shall consider here the systems with variable inductance, or with the control of a variable electric parameter.

The mechanical memorization of a certain frequency is obtained by pre-disposing mechanical members so that to a determined control action will correspond to determined position of the memory member (pre-disposition keyboard) to which there corresponds in turn the movement of a variable member which determines the wanted tuning. At present an increasing use is made of variable reactances of capacitive type, controlled by a variable d.c. voltage.

These devices, as they have no need of moving mechanical members, allow the use of controls of a purely electric type and an electric parameter is morized instead of a mechanical position.

In the present practice use is made of potentiometers located on a suitable push-button panel allowing the selective insertion at will of the user. The memory operations are carried out as follows:

by pressing the relative push-button, the potentiometer to be used as memory element is selected, said potentiometer is adjusted until obtaining the tuning of the wanted station, and each time the wanted station will have to be received, it will be sufficient to depress a push button associated thereto in order to listen to the station again.

According to the present invention, an entirely different principle is adopted, consisting in memorizing under digital form the voltge datum as necessary for tuning the wanted station, together with variable capacitance diodes as tuning members. It is to be understood that this invention can be applied to all cases wherein it is necessary to memorize control functions which can be obtained by means of variations of electric parameters, and therefore the following specification will refer to an embodiment serving an illustrative but non limitative function.

The present invention will now be described with reference to the attached drawings wherein.

Figure 1:
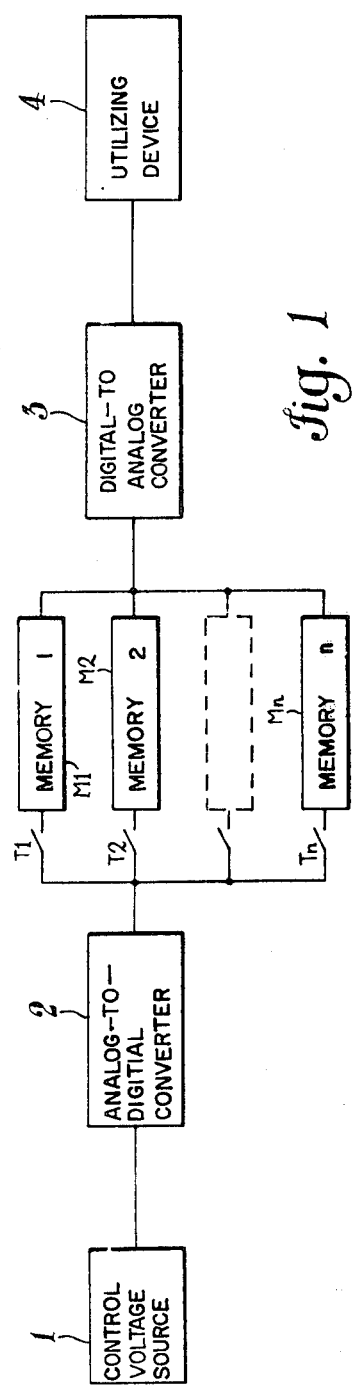
FIG. 1 shows the general block diagram of the arrangement for controlling, memorizing and retrieving of the tuning control voltage according to this invention.

With reference to the drawings and particularly to FIG. 1, a control member 1 is provided which supplies a d.c. control voltage, the variation of which can be manually effected. In more advanced embodiments it is possible to provide in the block 1, an automatic-stop ramp generator for searching the broadcasting stations.

The output control voltage from the block 1 is carried to an analog-to-digital converter 2. The signal consisting of a binary word "passes through" a selected one of the memories M1, M2 . . . M$n$, in order to reach a digital-to-analog converter 3 in order to provide a voltage substantially corresponding to the original control voltage for actuating the utilizing device, such as a voltage controlled radio tuner.

In the block diagram of FIG. 1, the functions as follows are thus embodied:

(1) Transformation of the analog control parameter into a digital parameter;

(2) Memorization of the digital parameter;

(3) Restitution of the digital parameter and transformation thereof into an analog parameter in order to provide the control. These functions will be now examined in detail.

1. TRANSFORMATION OF THE ANALOG CONTROL PARAMETER INTO A DIGITAL PARAMETER

Figure 2:
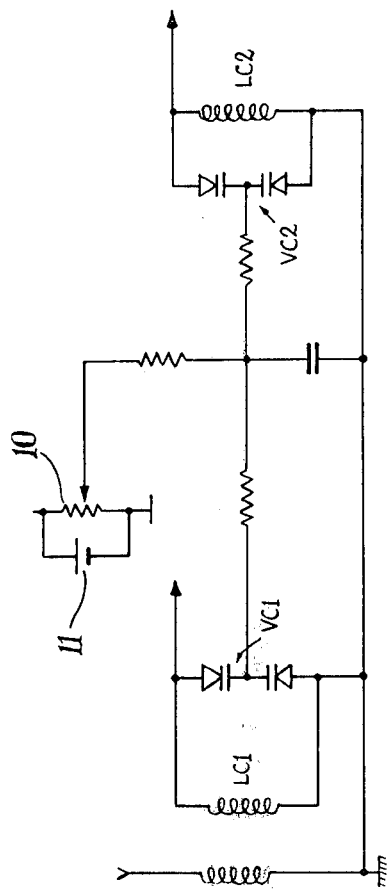
FIG. 2 shows in a simplified and largely diagrammatical way a typical tuning arrangement with electrically controllable capacitive reactances.

In FIG. 2, the tuning of the radio tuner is achieved in the way commonly used in the art of applying "Varicap" diodes, and this occurs by means of a suitable knob of a potentiometer 10 fed by a source 11 of stabilized d.c. voltage. To each voltage value present on the slider of the potentiometer, there corresponds a capacitance value of the Varicap, diodes V$c$1, V$c$2, and consequently a single frequency of the oscillating circuits LC1, LC2 in which these Varicap diodes are inserted.

In order to obtain the transformation of the aforesaid analog voltage into a digital number, various systems can be adopted: the use of an analog-to-digital converter which is a device which creates a one-to-one correspondence between the input variable voltage and output digital number, or the counting of the oscillations of the oscillating circuit controlled by the Varicap diode, in a determined time period, to obtain a number of pulses which is tied to the actual frequency of said oscillator.

Figure 3:
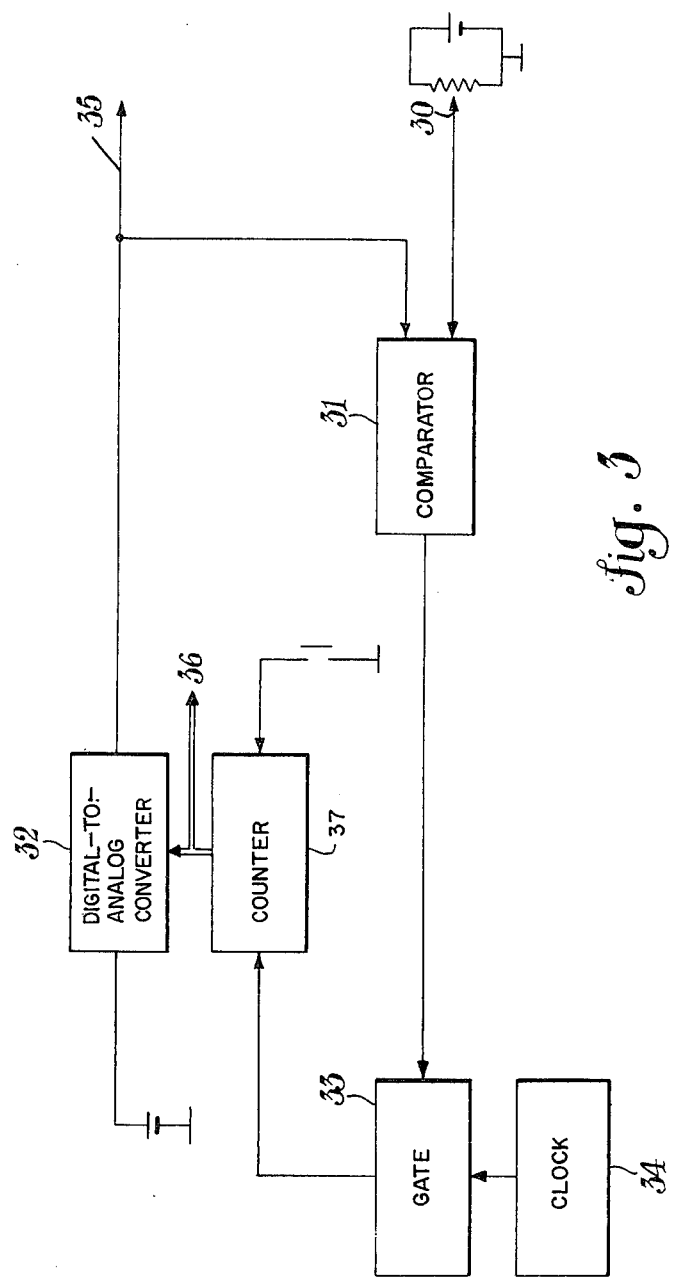
FIG. 3 shows diagrammatically a solution at present preferred in order to obtain the control voltage for the capacitive reactances, starting from a voltage control.

In the embodiment at present preferred, the arrangement illustrated in FIG. 3 is used. In this arrangement the control voltage 30, obtained by a reference source, is compared in a level comparator 31, with the output voltage from an analog-to-digital converter 32 which will be better described later on.

When no level equality exists between the two voltages, the output from level comparator 31 is a control voltage which enables the passage, through the gate circuit 33 of the pulses generated by a clock generator 34.

These pulses from clock generator 34 are counted by a digital counter 37 and originate, through digital-to-analog converter 32, a stepped voltage ramp on line 35 which controls both the actuation of the control devices (for instance the Varicap diodes) and the operation of the gate circuit 33 through the level comparator 31. Finally from the output 36 of the system, a number expressed in binary terms is obtained which corresponds to the control voltage which is intended to be memorized.

2. MEMORIZATION OF THE DIGITAL PARAMETER

In order to obtain the memorization of the digital parameter corresponding to the tuning voltage it is possible to have recourse to one of the several means well known in the present art. For instance: a digital number can be transferred into a serial memory register (shift register) wherefrom it is possible to obtain then the transfer to a digital counter allowing the memorized number to be utilized, and the number to be re-written in the memory shift register.

Another system can be that of using random access memories (RAM). By the large integrations of the logic functions on a single chip, it is possible to have memories capable of storing a large amount of binary information. By way of example, considering the frequency bands most commonly used in motor car radios, namely the Medium Wave and the Frequency Modulation bands, a 10 bit digital number results in a frequency error of 1.7 KHz in the Medium Wave band, and of 49 KHz in the Frequency Modulation band, namely a precision of the system comparable to, if not better than, that of a mechanical keyboard. It is evident that by the use of memories capable of storing a greater number of bits, the precision will remarkably increase until extremely precise values are obtained. The arrangement according to this invention which uses one of the aforesaid systems, needs to permanently maintain the power supply connected to the memory circuit, as the data must remain stored even when the receiver is off, but due to the low power absorption of the cited device, this constitutes no problem. Alternatively it is possible to take into consideration the use of the "EAROM" electrically alterable memories which from the functional standpoint have the characteristic of storing a data even in the absence of the power supply, but have no difference with respect to the simpler and less expensive conventional RAM memories. Summarizing, by having recourse to one of the cited systems it is possible to obtain a permanent memorization of the tuning data and due to the specific characteristic of the above cited devices, it is possible to obtain also the restitution at will of the memorized datum.

3. RESTITUTION OF THE DIGITAL PARAMETER AND ITS TRANSFORMATION INTO AN ANALOGIC PARAMETER IN ORDER TO OBTAIN THE TUNING CONTROL

Also the transformation of a digital number into an analog parameter is obtained by means known in the art. Particularly, suitable integrated circuits exist effecting said operations, or more simply it is possible to have recourse to a "weighing" system, by means of calibrated resistances of the "R-2R" type, of the digital parameter directly obtained by the memory.

By using one of these systems it is thus possible to pass from a digital number to a d.c. voltage allowing the control to be carried out, and therefore in the case of a radio-receiver, the adjustment of the tuning Varicap diodes so as to listen again to the memorized broadcasting radio stations.

ACCESSORY MEMBERS FOR CONTROLLING THE DEVICE AND FOR DISPLAYING THE MEMORIZED STATION

It is not intended to describe in detail the means allowing the control of the device, forming the subject matter of this invention, to be obtained, as several solutions are possible, easily accessible to a person skilled in the art. The selection is the consequence of an appraisal of the economical and functional parameters, specific to the single solutions.

By way of description and therefore in a clearly non limitative way, the use of "sensor" push buttons is cited, allowing the introduction into the memory and the retrieval therefrom of the digital parameter and the subsequent logic operations connected thereto or the embodiment of push-button switches wherein are reproduced in a simple way and thus economically the functions of a common mechanical keyboard (extraction-=introduction into the memory; introduction = retrieval from the memory). As far as, on the contrary, the display of the tuned and/or memorized frequencies is concerned, it is possible to have recourse, also to several systems, for instance to the use of electro-optical devices for digital display, either gas discharge devices or solid state devices (7 segments); also use can be made of either a frequency calibrated galvanometric needle instrument or discontinuous scales obtained by means of electroluminescent diodes; also in this case the choice is conditioned by economic and functional parameters typical of each embodiment.

Figure 4:
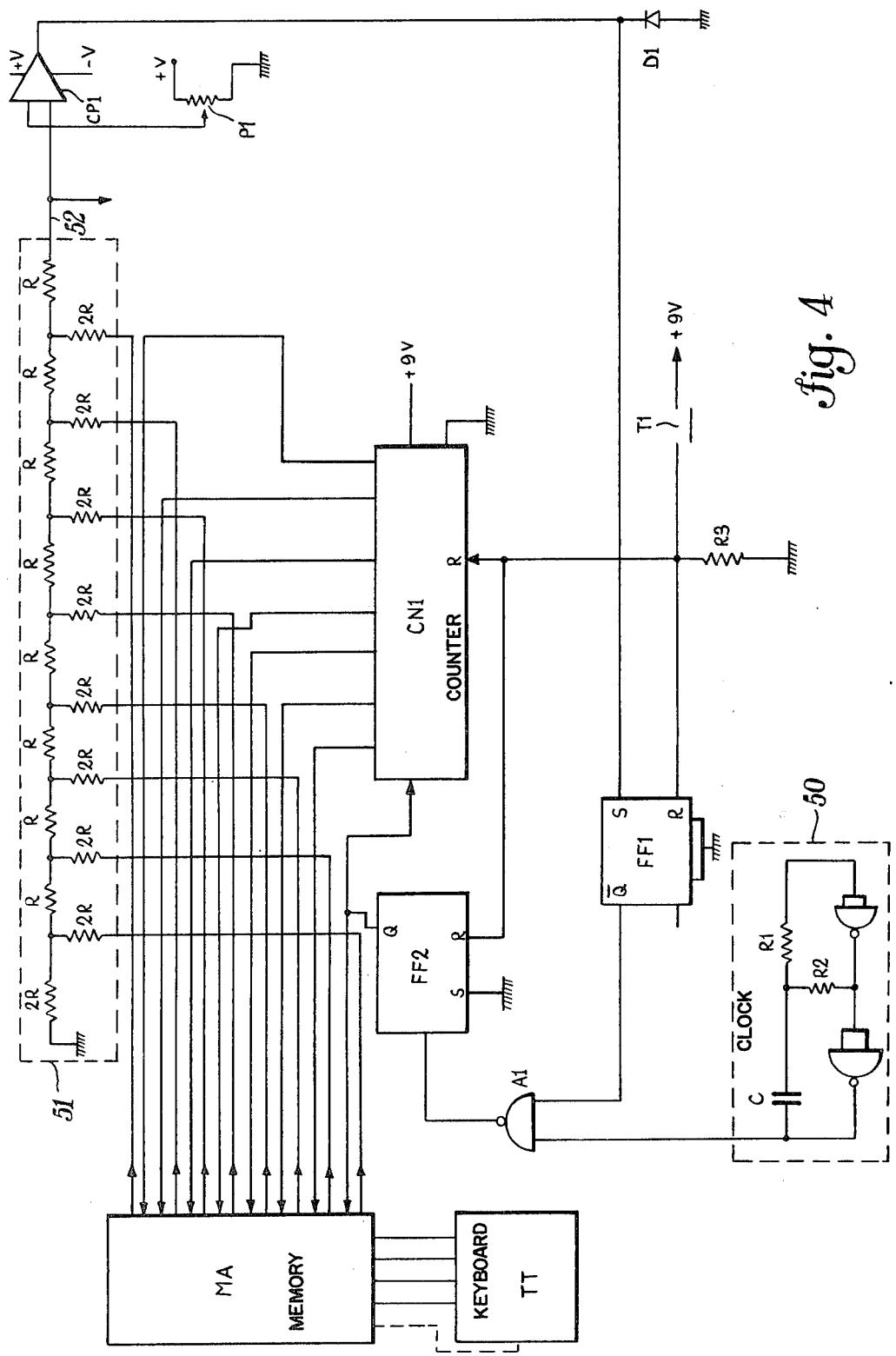
FIG. 4 shows a detailed diagram equivalent to that of FIG. 3, associated with a solid state and digital type memory member.

A diagrammatical example of the embodiment at present preferred is shown in FIG. 4.

This FIG. shows that the functions as previously described and illustrated in FIG. 3 have been maintained with the addition of a memory associated with the counter and the digital-to-analog converter network, and of a set of controls characterized by multiple switches, capable of embodying the access code to the memory.

Under rest conditions, the memory is rendered "transparent," i.e., it can be passed through by signals coming from the counter towards the digital-to-analog converter, while by operating the controls of the keyboard the "writing" into the memory, or the "reading" of the memorized datum is obtained.

With reference with FIG. 4, the tuning control is associated to the potentiometer P1 which supplies a voltage to one of the inputs of the comparator CP1. Assuming that the push-button T1 is operated, flip-flop FF1 is placed in RESET and this flipflop, by its output enables the NAND gate A1 to pass the clock oscillations of a clock generator 50 and which can consist of two inverters, RC coupled in a known way. The clock pulses, from the gate A1 pass to the counter formed by flip flop FF2 and by counter CN1, cascade connected in a known way. In the example illustrated in the FIG. 4, counter CN1 is a 8 bit counter.

The 8 bit word formed by the state of the aforesaid counter, "passes through" the RAM memory MA in order to reach the R-2R network 51. The output 52 from the network 51 represents the re-conversion into analog of the voltage supplied by the slider of the potentiometer P1. If a coincidence exists between the voltage of the slider of the potentiometer P1 and the output voltage from the network 51, the comparator CP1 commutates, setting flip flop FF1, which disables the gate A1, stopping the counting. Simultaneously, the voltage available at the output 52 controls the variable capacitance diodes for tuning the radio-receiver. The binary "word" representing this certain voltage corresponding to a certain radio station can be stored in memory MA through a control in the keyboard TT. The keyboard TT allows selection of the address in the memory MA in a way well known to a person skilled in digital techniques, in which the particular 8 bit binary words must be memorized.

This word can be retrieved at will, applying it to the inputs of the network 51 in order to tune again a certain broadcasting station. The number of stations which can be memorized clearly depends upon the capacity of the memory MA, and compatibly with costs, it can be great at will. The memory MA can be rendered non volatile as previously explained, by a permanent supply.

The start control as supplied by the RESET of the flip flop FF1 can be associated with the operation of the potentiometer P1, in order to render automatic the tuning operation, for instance by means of a "sensor" control as aforesaid. As stated above, FIG. 4 is a diagrammatical example of the embodiment of the present invention at present preferred. The components of FIG. 4 correspond with those of FIG. 3. Thus, potentiometer P1 of FIG. 4 corresponds with voltage control 30 of FIG. 3, comparator CP1 corresponds with comparator 31, network 51 corresponds with digital-to-analog converter 32, gate A1 corresponds to gate 33, clock generator 50 corresponds to clock generator 34, output line 52 corresponds to output line 35, the lines coupling RAM MA correspond to line 36, flip-flop FF2 and counter CN1 correspond to counter 37, and switch button T1 corresponds to the reset pushbutton of counter 37.

As an alternative to the embodiment as described, instead of the control with a potentiometer and a voltage comparator, it would be possible to provide a pulse generator controlled by the turning movement of the tuning knob, if the case may be associated to a reversible counter with an increment and decrement control depending upon the sense of rotation of the tuning knob.

The present invention has been described with reference to one embodiment thereof disclosed by way of non limitative mere example, as several variations and modifications could be planned by a person skilled in the art, without departing from the scope of the present industrial privilege.

Having thus described the present invention, what is claimed is:

1. A circuit for generating and digitally storing control voltage signals for application to electronic tuning circuitry of an electronically tuned radio receiver comprising manual control means for generating a first control voltage; a clock pulse generator; counter means for counting clock pulses from said clock pulse generator; a digital-to-analog converter coupled to said counter means and adapted to supply a second control voltage, indicative of the number of clock pulses counted by said counter means, to electronic tuning circuitry of an electronically tuned radio receiver; a voltage comparator having a first input, a second input, and an output; the output from said converter being connected to the first input of said voltage comparator; the second input of said voltage comparator being connected to said manual control means; a gate circuit coupling said clock pulse generator to said counter means; the output from said voltage comparator being connected to said gate circuit to discontinue the supply of said clock pulses to said counter means when the second control voltage is substantially equal to the first control voltage; and digital memory means coupled to the outputs from said counter means and to the inputs of said digital-to-analog converter and arranged to digitally store clock pulse count signals corresponding to control voltages associated with tuning frequencies of selected radio broadcasting stations.

2. A circuit as claimed in claim 1 in which said digital memory means is a RAM memory the capacity of which is at least as great as the number of counting stages of said counter means.

3. A circuit as claimed in claim 1 further comprising a keyboard coupled to said digital memory means for selecting memorizing addresses corresponding to the tuning frequencies of the selected radio broadcasting stations.

4. A circuit as claimed in claim 1 further comprising a radio receiver having electronic tuning circuitry coupled to said digital-to-analog converter to receive the control voltage therefrom.

5. A circuit as claimed in claim 4 in which said electronic tuning circuitry includes Varicap diodes.

* * * * *